(12) United States Patent
Brinkmann et al.

(10) Patent No.: US 6,753,214 B1
(45) Date of Patent: Jun. 22, 2004

(54) PHOTODETECTOR WITH ISOLATION IMPLANT REGION FOR REDUCED DEVICE CAPACITANCE AND INCREASED BANDWIDTH

(75) Inventors: David Brinkmann, Broomfield, CO (US); John Lindemann, Louisville, CO (US); Jeffrey Scott, Carpinteria, CA (US)

(73) Assignee: Optical Communication Products, Inc., Woodland Hills, CA (US)

( * ) Notice: Subject to any disclaimer, the term of this patent is extended or adjusted under 35 U.S.C. 154(b) by 0 days.

(21) Appl. No.: 10/076,939

(22) Filed: Feb. 15, 2002

Related U.S. Application Data (60) Provisional application No. 60/269,563, filed on Feb. 16, 2001.

(51) Int. Cl.[7] .................. H01L 29/06; H01L 29/12; H01L 27/15; H01L 33/00; H01L 31/0328
(52) U.S. Cl. .................. 438/184; 257/31; 257/43; 257/82; 257/84; 257/85; 257/92; 257/96; 257/99; 257/185; 257/186; 257/187
(58) Field of Search ............... 257/31, 43, 82, 257/84, 85, 92, 96, 99, 184, 185, 186, 187

(56) References Cited

U.S. PATENT DOCUMENTS

| | | | | |
|---|---|---|---|---|
| 3,604,987 A | * | 9/1971 | Assour | 257/443 |
| 5,606,572 A | * | 2/1997 | Swirhun et al. | 372/96 |
| 5,726,440 A | * | 3/1998 | Kalkhoran et al. | 250/214.1 |
| 5,729,563 A | * | 3/1998 | Wang et al. | 372/50 |
| 5,757,836 A | * | 5/1998 | Jiang et al. | 372/50 |
| 5,812,581 A | * | 9/1998 | Cox | 372/50 |
| 6,392,256 B1 | * | 5/2002 | Scott et al. | 257/184 |
| 6,483,862 B1 | * | 11/2002 | Aronson et al. | 372/50 |
| 6,489,232 B1 | * | 12/2002 | Derkits et al. | 438/637 |
| 6,586,718 B2 | * | 7/2003 | Matsuda | 250/214.1 |

* cited by examiner

*Primary Examiner*—John F. Niebling
*Assistant Examiner*—Stanetta Isaac
(74) *Attorney, Agent, or Firm*—Barlow, Josephs & Holmes, Ltd.

(57) ABSTRACT

A PIN photodetector includes reduced parasitic capacitance and is suitable for high-speed applications. Metal interconnect leads are coupled to the photodetector and extend over electrically insulating regions which reduce or eliminate parasitic capacitance. The electrically insulating regions may be formed by a deep proton implantation process which introduces impurities into the N-type layer, P-type layer and intrinsic layer in portions of the inactive area according to one embodiment. In another embodiment, the electrically insulating regions may be formed by removing parts of the film stack that includes N-type layer, P-type layer and intrinsic layer, from portions of the inactive area, introducing impurities and optionally adding a dielectric material. The PIN photodetector may take on the shape of a mesa to provide contact to each of the upper and lower electrodes.

34 Claims, 9 Drawing Sheets

PHOTODETECTOR WITH ISOLATION IMPLANT REGION FOR REDUCED DEVICE CAPACITANCE AND INCREASED BANDWIDTH

RELATED APPLICATION

This application claims priority of U.S. Provisional Application serial No. 60/269,563, entitled "Photodetector With Isolation Implant Region For Reduced Device Capacitance and Increased Bandwidth", filed Feb. 16, 2001, the contents of which are hereby incorporated by reference.

Commonly-assigned U.S. patent application Ser. No. 09/348,353, entited "Closely-Spaced VCSEL and Photodetector For Applications Requiring Their Independent Operation", is hereby incorporated by reference for all purposes as if set forth in its entirety.

FIELD OF THE INVENTION

The present invention relates generally to photodetectors, and more particularly to a PIN photodetector with reduced capacitance and increased bandwidth.

BACKGROUND OF THE INVENTION

PIN photodetectors are used in a wide variety of applications in today's optoelectronics industry. For example, PIN photodetectors are commonly used as optical monitors and optical receivers.

P-i-N (PIN) photodetectors consist of an intrinsic layer formed between a P-type layer and an N-type layer. When an electric field is applied across the device, the intrinsic layer is depleted of free carriers and the majority of the electric field forms across this region effectively creating a parallel plate capacitor. Light directed towards the device is absorbed in the intrinsic region, creating electron-hole pairs. A current proportional to the light absorbed in the intrinsic region ("photocurrent") is generated when the electrons and holes are accelerated to the N-type and P-type regions respectively, by the electric field.

A typical application for such a device is the detection of an amplitude modulated optical signal. In such an application, the maximum modulation frequency is determined by the overall bandwidth of the device and the minimum modulation detectable is determined by the optical sensitivity of the device. Therefore, two important issues associated with PIN photodetectors are the device capacitance, which is important in determining bandwidth, and responsivity which is important in determining overall sensitivity of the photoreceiver.

In order to maximize the amount of light coupled from a given optical source, it is desirable to maximize the light absorbing area of a photodetector. A larger detector area also increases the tolerance to poor or variable coupling to a given optical source. As the size of the PIN photodetector increases, however, the parasitic capacitance associated with the PIN photodetector also increases. When the capacitance associated with the photodetector is too high, the photodetector may not function in high-speed applications such as 2.5–40 Gbps (gigabit per second) optical receivers, for example. In order to optimize the performance of a PIN photodetector, it is therefore desirable to minimize the parasitic capacitance incurred due to other features in the detector.

A significant source of parasitic capacitance can exist between the interconnect metalization and/or bond pad, and subjacent regions such as contact layers or the underlying substrate. The interconnect metalization may provide electrical connection between each of the P-type electrode and N-type electrode, and the bond pads. The metal interconnect leads which form the bond pad and provide electrical contact between the PIN photodetector and the bond pad, are necessarily considerable in size due to wirebonding footprint requirements in standard industry practice. Underlying these interconnect leads may be other metal or semiconductor layers used to form connections, and the substrate upon which the photodetector is fabricated may be a conductor itself. As such, the parasitic capacitance arising between the substrate or other layers and the interconnect metal and bond pad, can represent a significant portion of overall parasitic capacitance.

Practical application of photodetectors also gives rise to signal-to-noise ratio considerations. The signal provided by a photodetector is the photocurrent previously discussed. However, all PIN photodetectors also generate noise current in the absence of light (termed dark current) due to diode leakage mechanisms such as minority carriers, thermally generated carrier pairs, and junction edges at semiconductor surfaces. Since the amplifying circuitry into which the output of a photodetector is typically sent, cannot distinguish photocurrent from dark current, minimizing dark current is important to preserving signal integrity in these systems.

SUMMARY OF THE INVENTION

According to one exemplary embodiment, the present invention provides a PIN photodetector formed of a stack of layers including a P-type layer, an intrinsic layer, and an N-type layer in an active area. A conductive interconnect lead couples the upper of the P-type layer or the N-type layer to a bond pad and is formed over an electrically insulating region formed in an inactive region. The electrically insulating region may reduce parasitic capacitance, as it essentially electrically insulates the conductive interconnect lead from the underlying N-type or P-type layer, and/or the substrate in the inactive area.

According to another exemplary embodiment, the present invention provides a PIN photodetector comprising a stack of layers including a P-type layer, an intrinsic layer and an N-type layer in an active area, at least portions of the stack extending out of the active area and into an inactive area. At least portions of the stack in the inactive area include a concentration of protons or other ionic impurities sufficient to render the portions of the stack electrically insulating. A metal interconnect lead electrically coupled to the stack within the active area, extends over the inactive area and is electrically insulated from the substrate by the impurity doped portions.

According to another exemplary embodiment, the present invention provides a PIN photodetector including a P-type electrode, an intrinsic layer and an N-type electrode in an active area. The PIN photodetector is formed of a stack of layers including an upper layer which is either the P-type or N-type electrode and an intermediate intrinsic layer formed over a conductive substrate which serves as the other of the P-type or N-type electrode in the active area. A conductive interconnect lead couples the upper electrode to a bond pad and is formed over an electrically insulating region formed in an inactive region. The electrically insulating region may reduce parasitic capacitance, as it essentially electrically insulates the conductive interconnect lead from the underlying conductive substrate in the inactive area.

According to another embodiment of the present invention, the PIN photodetector includes a mesa structure.

The active area is formed in a mesa structure which includes the upper P or N-type layer and an intrinsic layer. The PIN photodetector comprises a stack of layers formed over a substrate in an active area, the stack including an N-type layer, an intrinsic layer and a P-type layer arranged to include an upper layer formed of one of the N-type layer and the P-type layer, an intermediate layer formed of the intrinsic layer and a lower layer formed of the other of the N-type layer and said P-type layer. The upper and intermediate layers essentially terminate at a sidewall of the mesa structure. The lower layer extends from the mesa in the inactive area, and each of the upper and lower layers are electrically coupled to separate metal interconnect leads. The upper layer includes an impurity species included in a peripheral portion to render the peripheral portion essentially electrically insulating.

According to another exemplary embodiment, the present invention provides an array of PIN photodetectors as described in one or more of the above embodiments, formed on a substrate.

According to yet another exemplary embodiment of the present invention, a method for producing a PIN photodetector is provided. The method includes forming a P-type layer, an intrinsic layer and a N-type layer over a substrate to form a film stack including an upper layer of one of the P-type layer and the N-type layer, an intermediate layer of the intrinsic layer and a lower layer of the other of the N-type layer and the P-type layer. In another exemplary embodiment, the method includes forming an upper layer as one of the N-type or P-type electrode, and an intermediate intrinsic layer over a conductive substrate functioning as the other of the N-type or P-type electrode in the active area. The method also provides for defining an active absorbing area and an inactive area, and converting at least portions of the inactive area to substantially electrically insulating portions. An interconnect metal lead is formed over the electrically insulating portions within the inactive area and is electrically coupled to the upper layer.

BRIEF DESCRIPTION OF THE DRAWINGS

The present invention is best understood from the following detailed description when read in conjunction with the accompanying drawings. It is emphasized that, according to common practice, the various features of the figures are not to scale. On the contrary, the dimensions of the various features are arbitrarily expanded or reduced for clarity. Included are the following figures.

Like reference numerals denote like features throughout the specification and figures.

DETAILED DESCRIPTION OF THE INVENTION

PIN photodiodes and other photodetectors are coupled to bond pads to which electrical contact is made, by conductive interconnect leads that are commonly formed of metals. It is desirable to electrically insulate the interconnect metal leads and bond pads from any underlying conductive layers and/or the substrate, so that little or no parasitic capacitance results between the interconnect metal lead and bond pad, and such regions. With the parasitic capacitance so reduced, the PIN photodetector may be built to include a larger absorption area or other features that are consistent with the reduction of capacitance.

The various embodiments of the present invention are directed to forming PIN photodetectors with reduced parasitic capacitance and dark current, and which are suitable for use in high bandwidth optoelectronics applications including, but not limited to, 2.5–40 (or faster) Gbps optical receivers.

More particularly, the present invention is directed to forming electrically insulating regions outside the active area of a PIN photodetector, some of which are disposed beneath the metal interconnect leads and/or bond pads. In one embodiment, the electrically insulating region may be formed by a deep ion-implantation process. The implantation process may be referred to as an isolation implant or as a deep implant because the implanted region extends vertically through at least some of the stack of layers (the N-type layer, intrinsic layer, and P-type layer) which combine to form the PIN photodetector in the active region where these layers are not subjected to the isolation implant. According to another exemplary embodiment, a conductive substrate forms the bottom electrode of the photodetector and the stack of layers includes an upper P- or N-type layer and an intrinsic layer. According to one exemplary embodiment, a deep proton implantation is used to form the isolation region and render each of the layers electrically insulating. In another exemplary embodiment, the electrically insulating region may be formed by removing at least part of the film stack from at least part of the inactive area, then introducing an impurity into the region by an ion-implantation process. The void area produced by the film removal may further extend into the substrate and be optionally backfilled by a dielectric film, then have its surface planarized by any number of methods well known to those skilled in semiconductor fabrication arts. The electrically insulating region may extend into the substrate which may be a conductive or semi-insulating substrate.

According to another exemplary embodiment, which may or may not have included the formation of electrically insulating regions, the stack of films including an N-type layer, intrinsic layer, and P-type layer, may be etched to form a mesa structure which includes the intrinsic layer and the upper P or N-type layer in the active area. This is done by removing at least parts of the upper P or N-type layer and the intrinsic layer in at least parts of the inactive area. This exposes a large area of the lower P or N-type layer which extends circumferentially to adjacently surround the mesa and enables a large annular contact to be made between the lower P or N-type layer and a metal interconnect layer. The mesa embodiment may be used when the PIN photodetector is formed over a semi-insulating substrate, or over VCSEL layers as disclosed in previously-incorporated U.S. patent application Ser. No. 09/348,353. According to the mesa embodiment, a guard ring of an electically insulating region may be formed around the periphery of the upper P or N-type layer of the mesa structure, to reduce the component of dark current due to surface leakage. According to this exemplary embodiment, ohmic contact structures may be formed between each of the P or N-type layers and the corresponding metal interconnect layer. Other techniques and structures for contacting the P or N-type layers may be used in other essentially planar embodiments. For example, when a conductive substrate is used, contact may be made to the lower P or N-type layer through the substrate, and the upper P or N-type layer may be contacted through various arrangements. In other embodiments, the conductive substrate itself may serve as the lower electrode and lower P or N-type layer is not needed so contact may be made by contacting the conductive substrate itself.

Figure 1:
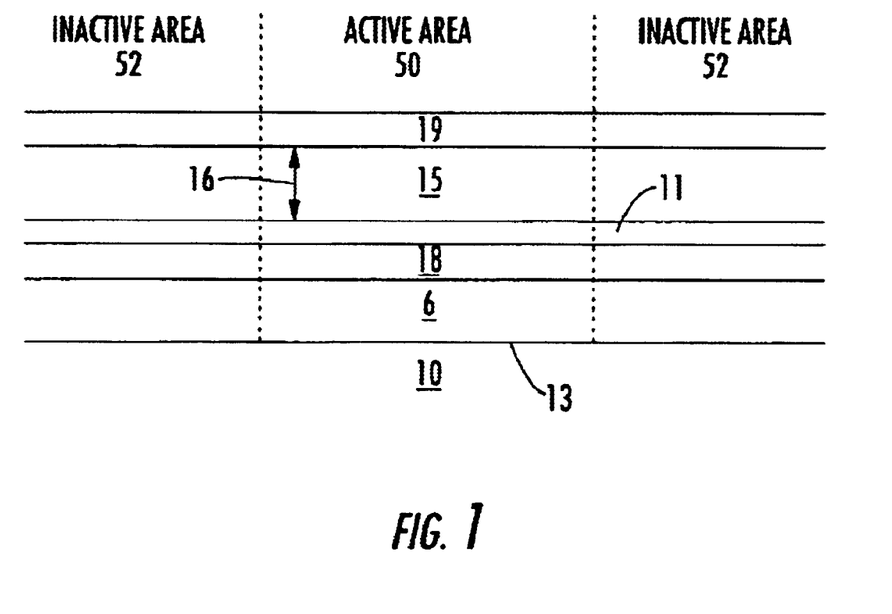
FIG. 1 is a cross-sectional view showing an exemplary film stack used to form a PIN photodetector.

FIG. 1 is a cross-sectional view showing an exemplary film stack used to form an exemplary PIN photodetector according to the present invention. The photodetector portion of the film stack will be formed in the designated active area which is the optically targeted area of the film stack. The PIN photodetector may be included in an array of similar PIN photodetectors formed on a common substrate. The array may be a linear or two dimensional array and it may be arranged for coupling to a corresponding array of optoelectronic devices or optical transmission media such as optical fibers. Although subsequently described as a single representative PIN photodetector and as a process for forming a representative PIN photodetector, it should be understood that such description is for brevity and that an array of PIN photodetectors and a method for simultaneously forming an array of PIN photodetectors on a substrate may be formed in accordance with the present invention.

The PIN photodetector shown in FIG. 1 includes lower P or N-type layer 18, upper P or N-type layer 19, and intrinsic layer 15 formed between lower P or N-type layer 18 and upper P or N-type layer 19. In one exemplary embodiment, upper P or N-type layer 19 is a P-type layer with lower P or N-type layer 18 being an N-type layer. In another exemplary embodiment, upper P or N-type layer 19 is an N-type layer with lower P or N-type layer 18 being the P-type layer. In this manner, the PIN photodetector includes an upper electrode being one of a P-type or N-type material and a lower electrode being the other of the P-type or N-type material. In the exemplary embodiment shown in FIG. 1, the PIN photodetector is formed over substrate 10 which may be semi-insulating gallium arsenide (GaAs) or indium phosphide (InP), but other semi-insulating materials may be used in other exemplary embodiments. Substrate 10 includes substrate surface 13. FIG. 1 also includes semiconductor mirror 6 formed directly over substrate 10 and beneath lower P or N-type layer 18. Semiconductor mirror 6 is added to increase the responsivity of the photodetector and is an optional feature. As such, according to other exemplary embodiments, semiconductor mirror 6 may not be used. Etch stop layer 11 is formed between lower P or N-type layer 18 and intrinsic layer 15 in an exemplary embodiment. According to other embodiments in which intrinsic layer 15 and lower P or N-type layer 18 have different etching characteristics, etch stop layer 11 may not be needed.

According to another exemplary embodiment, substrate 10 may be a conductive substrate. According to this exemplary embodiment, lower P- or N-type layer 18 may serve as the lower electrode of the PIN photodetector, or the lower P- or N-type layer 18 may not be used and the conductive substrate itself may serve as the lower electrode in the active area.

Figure 2:
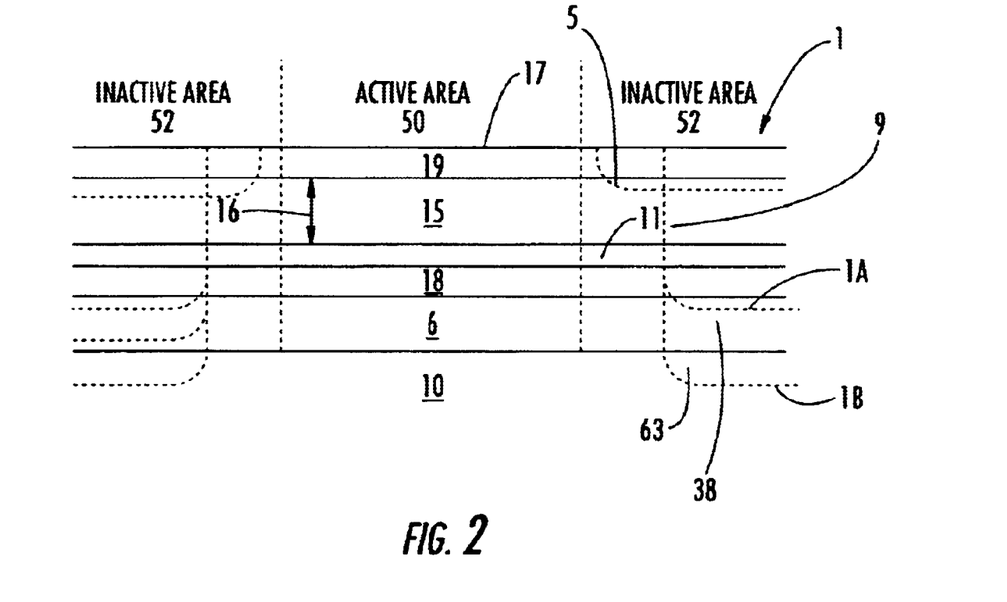
FIG. 2 is a cross-sectional view showing the exemplary film stack with impurities added.

In all figures, optically targeted or active area 50 is defined as the area in which light is absorbed and the stack of layers will serve as the PIN photodetector, and inactive area 52 is defined as all other regions. As shown in FIG. 2, in active area 50, light enters the photodetector through detector surface 17. FIG. 2 is a cross-sectional view showing the stack of layers shown in FIG. 1 after impurities have been added to the stack of layers. FIGS. 1 and 2 include active area 50 and inactive areas 52. A shallow implant process sequence is used to form guard ring 5 as will be discussed below. A deep implant process is used to form electrically insulating region 1, which includes portions 9, 38 and 63 depending on the depth of the deep implant process which may terminate at exemplary lower boundaries 1A, 1B, or others. The deep ion implantation process used to form electrically insulating region 1 is discussed below. Each of the electrically insulating region 1 and guard ring 5 are formed in inactive area 52.

In an exemplary embodiment, a transparent passivation layer 3, which also functions as an anti-reflective layer in the absorption region and which may be silicon nitride, may be formed over a detector surface 17. This will be shown in FIG. 3. Light travels through upper P- or N-type layer 19 and is absorbed within intrinsic layer 15.

Referring still to FIGS. 1 and 2, the composition and thickness 16 of intrinsic layer 15 may be chosen to optimize the tradeoff between a) bandwidth and b) absorption and responsivity.

Optional semiconductor mirror 6 is used in various exemplary embodiments to increase responsivity of the PIN by reflecting initially unabsorbed light back towards the intrinsic absorbing layer, thereby doubling the path of the light reflected by the mirror.

Optional semiconductor mirror 6 is formed using conventional means and materials and may comprise a DBR (distributed Bragg reflector). Conventional formation methods such as MBE (molecular beam epitaxy) may be used to form the films which comprise the DBR. In an exemplary embodiment, the DBR is non-intentionally doped. In one exemplary embodiment, semiconductor mirror 6 may be formed of alternating layers of aluminum arsenide (AlAs) and aluminum gallium arsenide (AlGaAs). In this embodiment, the AlGaAs layer may include a percentage of aluminum sufficiently high to provide for its transparency in the wavelength range of the light to be detected. In other exemplary embodiments semiconductor mirror 6 may be formed of alternating layers of other materials. The materials may be chosen to be lattice matched to the underlying substrate and they may be epitaxially formed to include a maximum difference in indices of refraction between the adjacent layers. As is conventional in the art, each of the sub-layers may be chosen to include a thickness being nominally equal to ¼ wavelength (in a vacuum) of the wavelength of interest which is to be reflected, divided by the index of refraction of the material, in one embodiment.

Other engineering models may be used to design and form the semiconductor mirror in other exemplary embodiments. A portion of the light which enters active area 50 of the PIN photodetector through detector surface 17 and which passes through intrinsic layer 15 without being absorbed, is reflected back into intrinsic layer 15 to be absorbed. This increases responsivity of the PIN photodetector. According to other exemplary embodiments in which intrinsic layer 15 absorbs a sufficient amount of light incident upon detector surface 17, semiconductor mirror 6 may not be needed. In an exemplary embodiment in which VCSELs (vertical cavity surface emitting lasers) are formed on the same substrate, the semiconductor mirror may also serve as one of the VCSEL mirrors for the VCSELs discretely formed on other parts of the substrate.

Lower P or N-type layer 18 is formed over semiconductor mirror 6 or it may be formed directly over substrate 10 according to embodiments in which semiconductor mirror 6 is not used. Lower P or N-type layer 18 may be chosen to be lattice-matched to substrate 10. In an exemplary embodiment, each of upper P or N-type layer 19 and lower P or-N-type layer 18 may be formed of AlGaAs. These layers serve as electrodes between which an electric field is applied and also as contact layers. As such, these layers may advantageously include a low resistivity. To reduce resistivity in the described gallium arsenide material system embodiment, P-type layers may be doped with carbon, zinc, magnesium or beryllium and N-type layers may be doped with silicon or antimony. Other dopant impurity species may be used in other materials system embodiments, as well as in other exemplary gallium arsenide material system embodiments. Conventional methods may be used to form the films and to introduce the appropriate dopant impurity species into the formed films. In one exemplary embodiment, each of lower P or N-type layer 18, etch stop layer 11, intrinsic layer 15 and upper P or N-type layer 19 are sequentially formed over the substrate using conventional molecular beam epitaxial deposition methods, but other film formation methods may be used in other exemplary embodiments. In one exemplary embodiment, a diffusion process may be used to add the appropriate dopant impurity species into the formed films and in another exemplary embodiment, an ion implantation process may be used. The films may alternatively or additionally be doped upon formation.

Upper P or N-type layer 19 is a P-type layer with lower P or N-type layer 18 being an N-type layer. Alternatively, upper P or N-type layer 19 is an N-type layer with lower P or N-type layer 18 being the P-type layer. According to either embodiment, layers 18 and 19 may be formed of a material that is transparent at the wavelength of interest and doped with the appropriate conventional dopant impurity to form a P or N-type layer. According to other exemplary embodiments, upper P or N-type layer 19 and lower P or N-type layer 18 may be formed of different materials. Upper P or N-type layer 19 may be chosen to be transmissive to light having the wavelength which is to be absorbed and detected. In an exemplary embodiment in which the PIN photodetector is used to sense light having a wavelength of 850 nanometers, the upper P or N-type layer 19 may be formed of AlGaAs, including an aluminum percentage great enough to ensure transmissivity to 850 nm light. According to other exemplary embodiments in which the photodetector is used to sense light having other wavelengths such as 1300 nm or 1550 nm, the composition of upper P or N-type layer 19 may vary in order to enhance transmissivity at the wavelength of interest.

Intrinsic layer 15 may be gallium arsenide according to various exemplary embodiments, but other materials may be used alternatively. Intrinsic layer 15 may be chosen to be lattice matched to substrate 10 and intervening layers. In an exemplary embodiment, intrinsic layer 15 may be formed over substrate 10 using conventional molecular beam epitaxial deposition methods, but other film formation techniques may be used in other exemplary embodiments. Intrinsic layer 15 may be chosen to be thick enough to maximize absorption and responsivity but thin enough to sufficiently minimize transit time of the carriers produced (electrons and holes) in the intrinsic layer so as to optimize high-speed performance. In an exemplary embodiment, gallium arsenide intrinsic layer 15 may have an absorption length of about 1 micron for light having a wavelength of 850 nm, and thickness 16 may range from 1 to 5 microns or more. According to one exemplary embodiment, thickness 16 may be approximately 2.0 microns. Other materials and thicknesses may be used in other exemplary embodiments. For example, intrinsic layer 15 may be formed of materials and include a thicknesses for optimally absorbing and detecting long wavelength light, such as an indium phosphide substrate and indium gallium arsenide absorbing layer for light having a wavelength on the order of 1.3 microns. Semiconductor mirror 6 may be particularly useful and may advantageously be utilized in conjunction with intrinsic layers which absorb less than an optimal amount of incident light.

According to the exemplary embodiment in which substrate 10 is a conductive substrate, lower P or N-type layer 18 may not be needed as substrate 10 serves as the lower P- or N-type electrode in active area 50. According to this exemplary embodiment, substrate 10 may be formed to include the appropriate doping characteristics as described above in conjunction with lower P- or N-type layer 18 in order to serve as the lower electrode with a desirably low resistivity. According to other exemplary embodiments, the portions of substrate 10 in active area 50 may be doped with appropriate conventional dopant impurities to form a P- or N-type region which serves as the lower electrode.

According to one embodiment in which etch stop layer 11 is used, etch stop layer 11 may be formed over substrate 10 using conventional molecular beam epitaxial deposition methods, but other film formation techniques may be used. Etch stop layer 11 is formed of materials that are resistant to etching in the chemistries and conditions used to etch superjacent layers upper P or N-type layer 19, intrinsic layer 15, and any other superjacent layers. Various materials may be used to form etch, stop layer 11. Etch stop layer 11 finds particular application in the mesa embodiment used to provide electrical connection to the PIN photodetector, as will be described below. According to the mesa embodiment, superjacent layers upper P or N-type layer 19, intrinsic layer 15, and any other superjacent layers are removed from over etch stop layer 11 in at least portions of the inactive area. The addition of the etch stop layer provides for a robust, well controlled etch process and therefore allows for the thickness of superjacent layers to be determined by implant considerations and not limitations in such etch processes.

After each of optional lower P- or N-type layer 18 and etch stop layer 11 are formed, and after the intrinsic layer 15 and upper P- or N-type layer 19 are sequentially formed over the substrate, a PIN photodetector is formed from the stack of layers, by defining the optically targeted area and providing contact to the upper and lower electrodes. Prior to forming the interconnect materials that contact either or both of the lower and upper electrodes, sections of the inactive areas 52 may be converted to electrically insulating areas. The interconnect leads and the bond pads to which they are connected, may be formed to extend over the electrically insulating areas to minimize parasitic capacitance between the interconnect leads and bond pads, and underlying contact layers and/or substrate, if a conductive substrate is used.

In one exemplary embodiment in which a non-conductive substrate is used and each of upper P- or N-type layer 19, intrinsic layer 15 and lower P- or N-type layer 18 are used, contact may be afforded by forming a mesa so that lower P- or N-type layer 18 extends from the mesa and may be contacted from above. In the mesa embodiment, other layers of the film stack essentially terminate at the peripheral edge or etched-sidewall and the active area is formed in the mesa. Vias or other contact openings may also be used to provide for contacting upper P- or N-type layer 19 and lower P- or N-type layer 18. In another exemplary embodiment in which a conductive substrate 10 is used, a dedicated metal interconnect lead and bond pad are not needed to contact the lower electrode as contact may be made to lower P- or N-type layer 19 through the substrate or the substrate itself may be the lower electrode.

Figure 3:
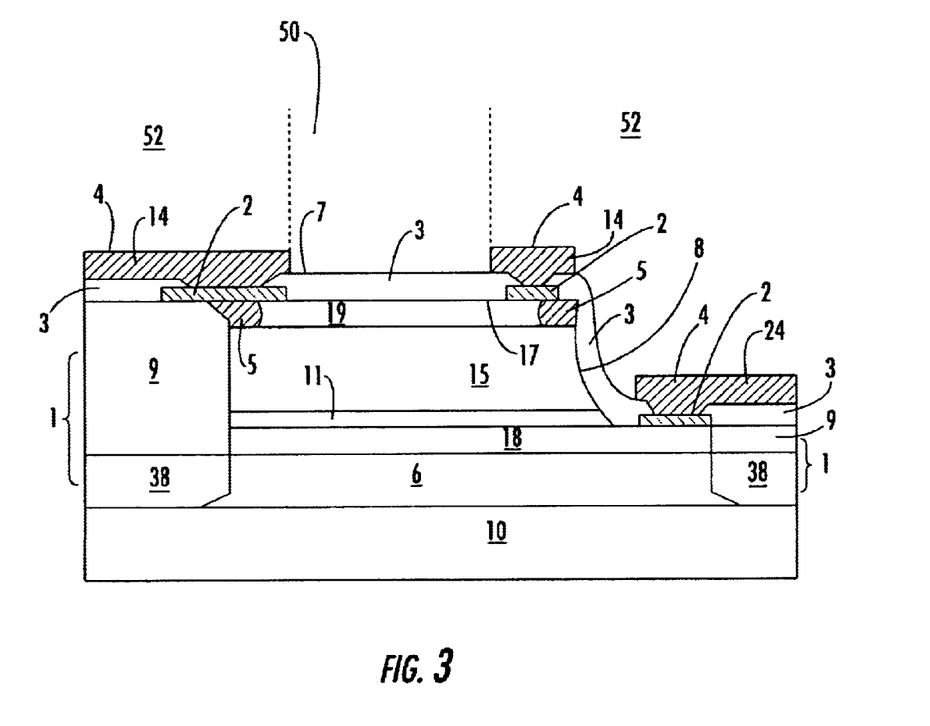
FIG. 3 is a cross-sectional view showing an exemplary embodiment of a PIN photodetector according to the present invention.
Figure 4:
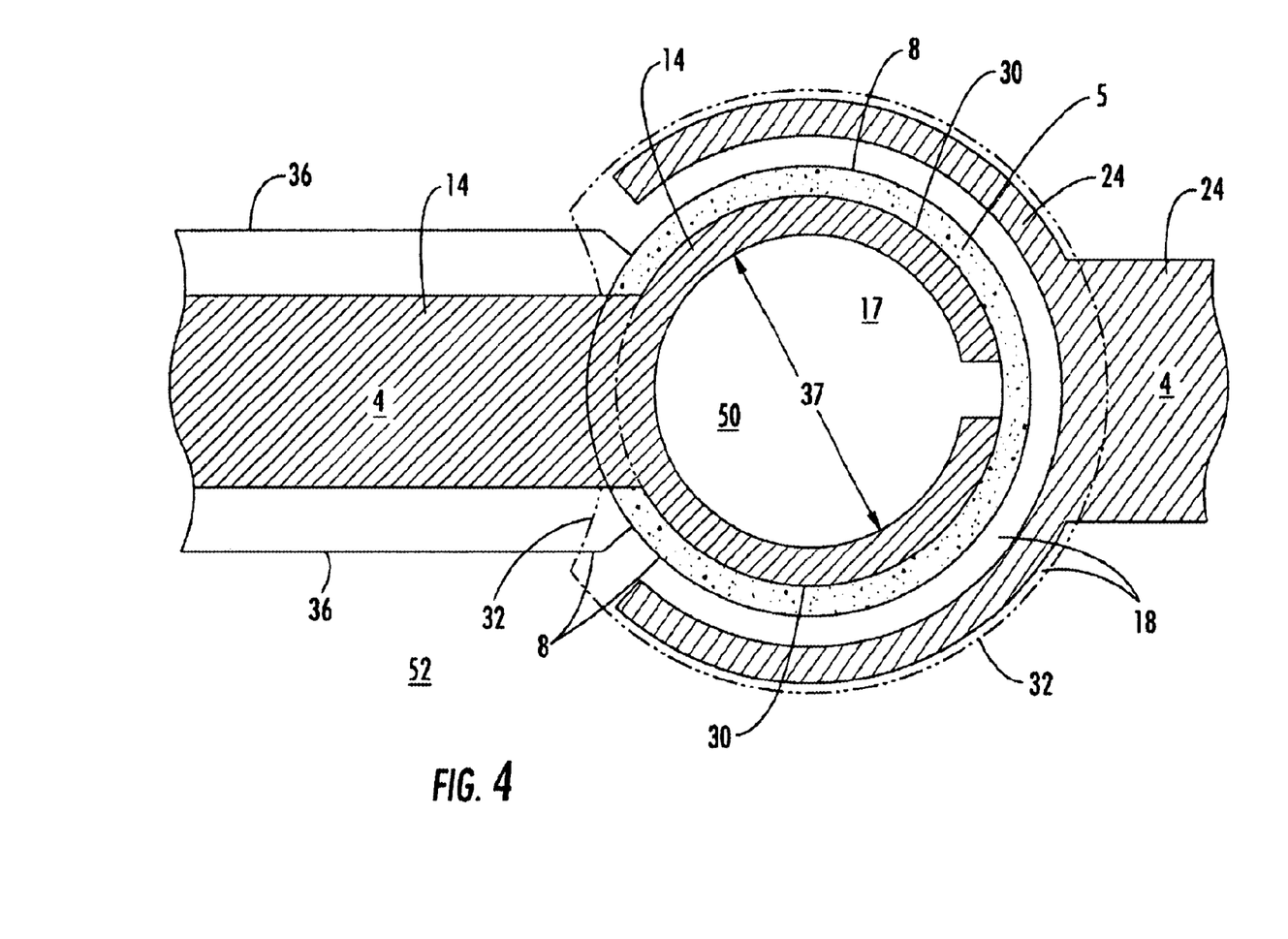
FIG. 4 is a plan view of an exemplary embodiment of the PIN photodetector of the present invention.

FIG. 3 is a cross sectional view that shows electrically insulating area 1 formed to extend through various layers of the film stack. Electrically insulating area 1 includes portions 9 and 38 in the illustrated embodiment. FIG. 3 also shows another exemplary embodiment of the present invention, namely, the mesa structure. FIG. 4 is a plan view of the exemplary mesa PIN photodetector shown in cross-sectional view in FIG. 3. The mesa structure may be used to form a PIN photodetector over a semi-insulating substrate or over VCSEL layers. In the following discussion, reference will be made to each of FIG. 3 and FIG. 4 in describing the method for forming an exemplary PIN photodetector using a mesa structure.

After the upper P- or N-type layer 19, intrinsic layer 15, lower P- or N-type layer 18 and any intervening layers are formed and before the structure is etched to form a mesa or other means are used to provide contact to lower P- or N-type layer 18 and upper P- or N-type layer 19, electrically insulating portions are formed within inactive area 52.

According to one exemplary embodiment, a deep ion implant process is carried out to implant ions into each of upper P- or N-type layer 19, intrinsic layer 15, lower P- or N-type layer 18, and any intervening layers such as etch stop layer 11 to form electrically insulating portions within inactive area 52. If the fundamental material system is gallium arsenide, the deep ion implant process may be a proton implant process used to form an isolation implant area that functions as the electrically insulating areas. According to other embodiments using other material systems for the upper and lower P- or N-type layer, other implant species that render these materials electrically insulating may be used. The implantation process is performed after masking active area 50 and portions of inactive area 52 with a material having a high atomic mass in order to block the implanted species. In one embodiment, a suitable thickness of gold, which may be patterned using conventional methods, may be used as the masking material. For example, a pattern in a preliminary masking film such as photoresist may be first formed, then the gold plated into exposed areas in the pattern prior to the removal of the photoresist material. Other techniques for masking active area 50 may be used. The region covered by the masking material and therefore blocked from the deep ion implant, is the region bounded by dashed line 32 of FIG. 4. Part of the region which is not implanted forms the active area of the PIN photodetector. The ion implantation may occur throughout most of the inactive area, as in the illustrated embodiment, or it may be limited to particular sections of the inactive area over which the metal interconnect leads, and possibly bond pads, will be formed. In yet another exemplary embodiment, the ion implantation may occur throughout the entire inactive area 52.

The disclosed isolation implant is a series of individual ion implantation processes of increasing energy. According to this embodiment, the sequence of isolation implantation process steps may implant ions to a considerable depth in order to convert each of the implanted layers to an electrically insulating material within inactive areas above which metal interconnect features will be formed. The ions may be proton sources such as ionic hydrogen, $H^+$, or other ions such as $O^+$. The deep implant includes implanting hydrogen into each of the upper P- or N-type layer 19, intrinsic layer 15, lower P- or N-type layer 18 and intervening etch stop layer 11 to form isolation implant portion 9 of electrically insulating area 1 as in the exemplary embodiment shown in FIG. 1. According to an exemplary embodiment, the composite thickness of the stack of layers being implanted, may be on the order of 1 to 6 microns, but other thicknesses may be used. A high implant energy is used to implant to such a considerable depth. The implant energies and process sequence will also be influenced by the materials that form the films. Other implant species and sequences may be used, depending upon the thicknesses and materials of the films that are being implanted to become electrically insulating.

According to various exemplary embodiments fabricated in gallium arsenide, and in which the maximum depth to be implanted varies from 2.0 microns to 5.9 microns (to accommodate various absorbing layer thicknesses), the following sequence of implantation steps maybe used.

Implant Species: H+
Wafer Tilt: <2
Wafer Rotation: approx. 30
Dose Rate: 2.5 $\mu$A/cm2.

Energy And Dose Schedule:

|  | Implants for 2.0 um implanted stack | | Implants for 3.4 um implanted stack | | Implants for 5.9 um implanted stack | |
| --- | --- | --- | --- | --- | --- | --- |
|  | Energy, KeV | Dose Per cm2 | Energy, KeV | Dose Per cm2 | Energy, KeV | Dose Per cm2 |
| Implant 1: | 160 | 3 e14 | 160 | 3 e14 | 160 | 3 e14 |
| Implant 2: | 200 | 3 e14 | 200 | 3 e14 | 200 | 3 e14 |
| Implant 3: | 240 | 2 e14 | 240 | 2 e14 | 240 | 2 e14 |
| Implant 4: | 270 | 2 e14 | 270 | 2 e14 | 270 | 2 e14 |
| Implant 5: |  |  | 300 | 2 e14 | 300 | 2 e14 |
| Implant 6: |  |  | 330 | 2 e14 | 330 | 2 e14 |
| Implant 7: |  |  | 350 | 2 e14 | 350 | 2 e14 |
| Implant 8: |  |  | 370 | 2 e14 | 370 | 2 e14 |
| Implant 9: |  |  | 400 | 2 e14 | 390 | 2 e14 |
| Implant 10 |  |  |  |  | 410 | 2 e14 |
| Implant 11 |  |  |  |  | 430 | 2 e14 |
| Implant 12 |  |  |  |  | 450 | 2 e14 |
| Implant 13 |  |  |  |  | 470 | 2 e14 |
| Implant 14 |  |  |  |  | 490 | 2 e14 |
| Implant 15 |  |  |  |  | 510 | 2 e14 |
| Implant 16 |  |  |  |  | 530 | 2 e14 |

Such energy and dose schedules are intended to be exemplary only and various other sequences and various other numbers of individual implant steps may be used. According to the embodiment in which the structure includes semiconductor mirror 6, the ion implant parameters may be adjusted to ensure that the semiconductor mirror is similarly implanted to form subjacent portion 9 of electrically insulating area 1. Electrically insulating area 1 is thereby formed in at least portions of inactive area 52 by introducing impurity species into upper P or N-type layer 19, intrinsic layer 15, etch stop layer 11, lower P or N-type layer 18 to form portion 9 and portion 38 may be formed in portions of optional semiconductor mirror 6. The implant process may also be adjusted to extend the isolation implant area into substrate 10, which may be a doped, conductive or semi-insulating substrate. The isolation implant area may extend to various exemplary depths and therefore include various lower boundaries, such as lower boundaries 1A and 1B shown in FIG. 2.

After the electrically insulating areas are formed in inactive area 52, portions of the film stack may be removed in portions of the inactive area to form a mesa structure to provide contact to lower P or N-type layer 18 as shown in FIG. 3. The methods for forming the mesa structure and for providing contact will be described below.

Figure 5:
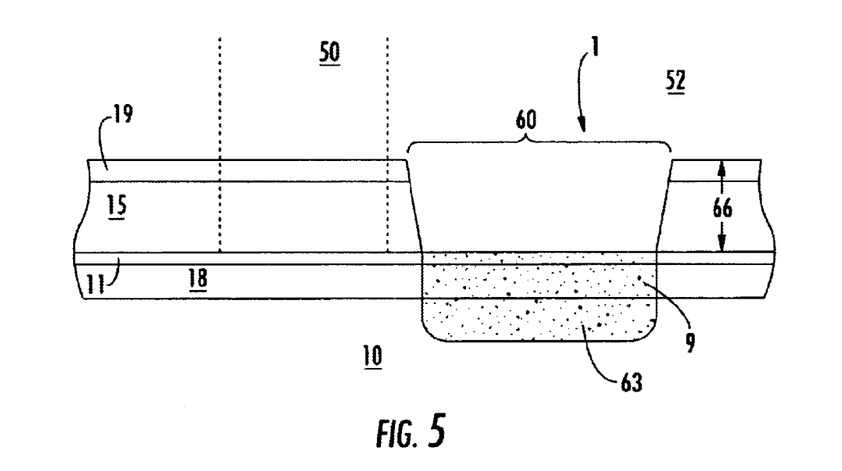
FIG. 5 is a cross-sectional view showing another exemplary embodiment of a PIN photodetector according to the present invention.

FIG. 5 shows another exemplary embodiment for forming electrically insulating area 1. Each of films lower P- or N-type layer 18, intrinsic layer 15, upper P- or N-type layer 19 and optional etch stop layer 11 may be formed as described above and within each of active area 50 and inactive area 52. Although not shown in the illustrated embodiment of FIG. 5, a semiconductor mirror may additionally be included within active, or optically targeted area 50. The mirror may further extend into inactive area 52. According to this exemplary embodiment for forming electrically insulating area 1, portions of upper P- or N-type layer 19 and intrinsic layer 15 are removed to form opening 60 in inactive area 52. This approach may be used according to exemplary embodiments in which the materials used to form intrinsic layer 15 and upper P or N-type layer 19, and thickness 66, require a relatively high energy implant to convert each of upper P- or N-type layer 19, intrinsic layer 15, lower P- or N-type layer 18, optional etch stop layer 11, and optional semiconductor mirror, to electrically insulating areas.

According to this exemplary embodiment, opening 60 is formed by conventional patterning and etching methods. Wet or dry etching procedures may be used. If optional etch stop layer 11 is used, the etching process is terminated at this layer, chosen to be unetchable in the chemistry and using the process conditions used to etch upper P or N-type layer 19 and intrinsic layer 15. According to another exemplary embodiment (not shown), only part of the film stack, including intrinsic layer 15 and upper P or N-type layer 19, may be etched and the etch terminated prior to exposing etch stop layer 11. According to yet another embodiment, an etch stop layer may not be used and a timed etch process may be used to partially remove parts of the stack of upper P- or N-type layer 19, intrinsic layer 15 and lower P- or N-type layer 18.

After the etching procedure is carried out and opening 60 formed, an ion implantation process may be used to form electrically insulating isolation implant portions 9 and 63. Various implant species and procedures may be used to render isolation implant portions 9 and 63 electrically insulating. In one embodiment, the isolation implant region extends through etch stop layer 11 and lower P- or N-type layer 18 and into substrate 10, which may be a doped substrate rendered essentially electrically insulating in isolation implant portion 63. Depending on depth 66 and other considerations, interconnect metalization leads may be formed over the arrangement shown in FIG. 5, or opening 60 may be first filled with a dielectric film.

Figure 6:
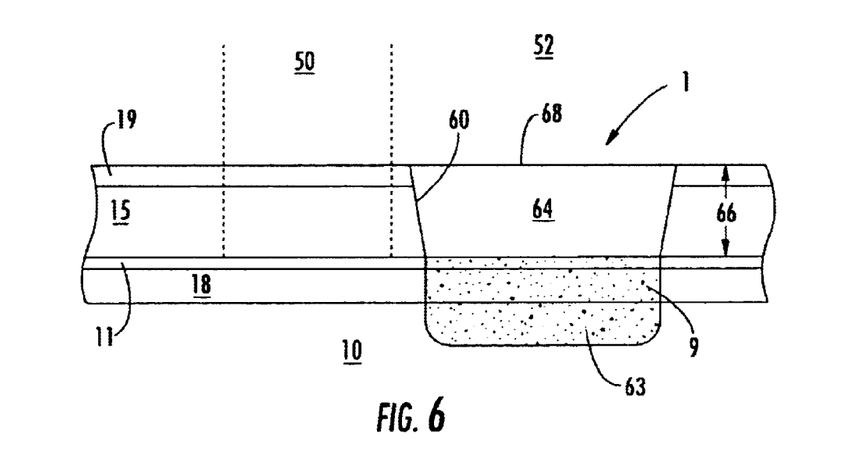
FIG. 6 is a cross-sectional view of yet another exemplary embodiment of a PIN photodetector according to the present invention.

According to another exemplary embodiment, opening 60 may be filled by dielectric material 64 after the isolation implant area is formed within electrically insulating area 1 and before forming the interconnect metalization. This is shown in FIG. 6. Spin on glass (SOG) or other dielectric materials may be used. According to one exemplary embodiment, chemical mechanical polishing may be used to planarize the structure and produce top surface 68. Conductive interconnect leads may be formed to provide contact to lower P- or N-type layer 18 and upper P- or N-type layer 19 after opening 60 is formed, or after opening 60 is formed and filled with dielectric material 64. Contact may be made by forming a mesa structure or using other techniques as described below.

Figure 7:
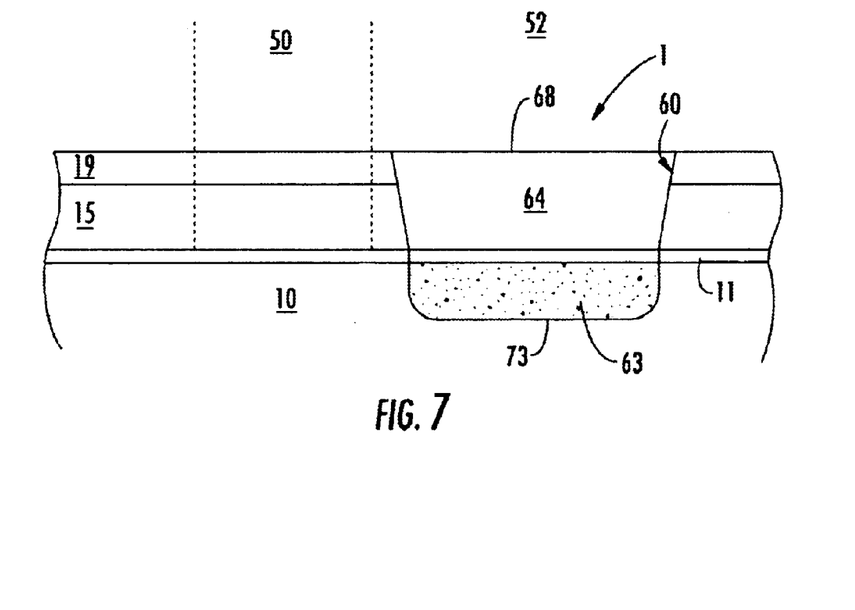
FIG. 7 is a cross-sectional view of another exemplary embodiment of a PIN photodetector according to the present invention.

In the case of a conductive substrate, it may not be practical to implant deep enough to render the entire substrate insulative. According to this embodiment, at least some capacitance mitigation can be obtained by implanting the substrate to the maximum practical depth before forming overlying interconnect metal leads or bond pads, thus moving the conductive surface which forms the bottom electrode of a potential parasitic capacitor, as far away as possible from the corresponding upper electrode formed by the interconnect lead or bond pad. This technique is illustrated in FIG. 7. In this illustrated embodiment, etch stop layer 11 is used to terminate the etch and substrate 10 is not etched. Electrically insulating area 63 is formed as above, and extends into substrate 10 and includes a sufficiently high concentration of impurity species to convert otherwise conductive substrate 10 into electrically insulating area 63. Opening 60 is filled with dielectric material 64 and may be planarized to produce surface 68, as described above.

Figure 8:
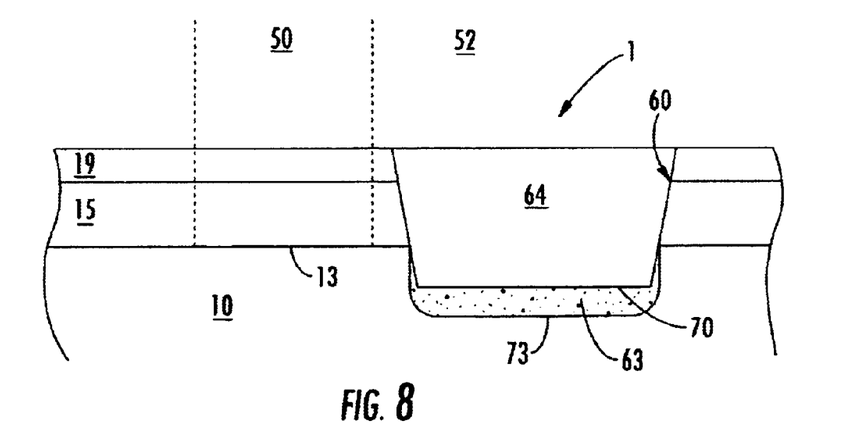
FIG. 8 is a cross-sectional view of a further exemplary embodiment of a PIN photodetector according to the present invention.

A variation of this technique is illustrated in FIG. 8 in which etch stop layer 11 is not present and substrate 10 is formed of conductive material. In FIG. 8, opening 60 extends into substrate 10 as the etch is allowed to proceed into the substrate and form bottom surface 70 which is below original substrate surface 13. In other exemplary embodiments, the etch may terminate at or above original substrate surface 13. In each of the illustrated embodiments of FIGS. 7 and 8, substrate 10 serves as the lower electrode of the RIN photodetector in active area 50. Also in FIG. 8, dielectric 64 fills opening 60 in electrically insulating area 1. In each of the embodiments illustrated in FIGS. 7 and 8, a capacitance reduction is provided and related to the additional separation between the upper electrode which may be formed over electrically insulating area 1 and the lower electrode of the potential parasitic capacitor defined by lower surface 73 of electrically insulating area 63. The technique of implanting impurities into the substrate as shown in FIGS. 7 and 8, may also be used in other embodiments which include additional layers such as lower P- or N-type layer 18 shown in previous figures. An opening may be formed in inactive areas 52 by removing part of the stack of layers from the inactive area then implanting through the unremoved layers and into the substrate.

After the electrically insulating area 1 has been formed by the exemplary methods described above, a guard ring may optionally be introduced onto the structure to further reduce parasitic capacitance and reduce dark current. The guard ring is particularly useful in the embodiment in which the active area is formed in a mesa structure, as shown in FIG. 3. The guard ring may prevent low impedance paths from forming on the exposed boundary between upper P- or N-type layer 19 and intrinsic region 15 when the mesa structure is formed. The guard ring may be formed using a shallow implant process. Guard ring 5 is shown in FIG. 3 and extends annularly inward from sidewall 8 of the mesa structure. The shallow implant consists of a series of implantation processes used to implant appropriate ionic species into upper P- or N-type layer 19 around the periphery of the mesa structure. When gallium arsenide is the fundamental material system, a proton source may be the ionic species so implanted. Referring to FIG. 4, the region blocked from the shallow implant is bounded by dashed line 30. Conventional masking materials and patterning techniques may be used to mask the active area of the detector with a material having a high atomic mass in order to block the implanted species. In an exemplary embodiment, a suitable thickness of gold, which may be patterned using conventional methods, may be used as the masking material.

An exemplary embodiment of the shallow implant process sequence used to form guard ring 5, in a gallium arsenide based photodetector, is as follows:

Implant Species: H+
Wafer Tilt: <2°
Wafer Rotation: approx. 30°
Dose Rate: 2.5 $\mu$A/cm2

Energy And Dose Schedule:

|  | Energy | Dose |
|---|---|---|
| Implant 1: | 10 KeV | 4 e14 per cm2 |
| Implant 2: | 20 KeV | 4 e14 per cm2 |
| Implant 3: | 40 KeV | 3 e14 per cm2 |
| Implant 4: | 80 KeV | 3 e14 per cm2 |
| Implant 5: | 120 KeV | 3 e14 per cm2 |

It should be understood that various other ionic species and implant process sequences may be used. More particularly, if the upper P or N-type layer includes a thickness greater than 0.4 microns, higher energies may be used to create the electrically insulating guard ring.

According to another exemplary embodiment, the guard ring implantation process may follow the etching process used to form the mesa structure as will be described below. It can be seen in FIG. 3 that guard ring 5 forms the outer peripheral edge of upper P or N-type layer 19 of the mesa structure which is implanted with the shallow implant. According to other exemplary embodiments the guard ring or shallow implant process may not be needed.

After electrically insulating area 1 is formed according to the various embodiments, the structure is processed to provide contact to each of the upper and lower electrodes of the structure. In one exemplary embodiment, an etching process is used to form a mesa structure such as shown in FIG. 3. According to the illustrated embodiment, the mesa structure will be generally round and will include an arm extending therefrom and which will include a metal interconnect lead subsequently formed thereover. The mesa structure includes peripheral edge or sidewall 8 and the arm is bounded by sides 36 as shown in FIG. 4. The mesa structure may take on different configurations such as rectangular, square, elliptical, or other. In the circular embodiment shown in FIG. 4, diameter 37 of absorbing surface 17 in active area 50, may range from 10 to 200 microns, but other diameters may be used alternatively. Diameter 37 is chosen in conjunction with the specific application of the photodetector and is large enough to allow significant tolerance for misalignment between absorbing surface 17 and the fiber optic, other optical medium or optoelectronic device to which it is coupled. A single etch process may be used to sequentially etch upper P- or N-type layer 19 and intrinsic layer 15, stopping at etch stop layer 11, after a suitable masking pattern has been formed. Suitable dry or wet etching processes may be used. Next, a separate etching process may be used to remove etch stop layer 11, stopping on lower P- or N-type layer 18, using a selective etch process to maintain the integrity of lower P- or N-type layer 18. Conventional etching processes may be used in each case. As formed, the mesa structure may include a height ranging from 1 to 5.5 microns. Such dimensions are exemplary and not restrictive of the mesa structure.

According to the exemplary embodiment in which the guard ring is used but not formed prior to etching the mesa, the pattering and implanting processes used to produce guard ring 5 may be carried out at this juncture.

After the mesa structure and optional annular guard ring have been formed and portions of lower P- or N-type layer 18 have thereby been exposed by etching, ohmic contact structures may be formed for contacting each of upper P- or N-type layer 19 and lower P- or N-type layer 18. Ohmic contact structure 2 directly contacts portions of upper P- or N-type layer 19 and lower P- or N-type layer 18. According to the exemplary embodiment, an ohmic contact layer may be formed over the entire substrate as a single ohmic film, then patterned to form discrete ohmic contact structures 2, to contact to each of upper P- or N-type layer 19 and lower P- or N-type layer 18. Conventional metal materials used as ohmic contact materials. AuBe/Pd/Au, AuZn or Ti/Pt/Au may be used for contacting P-type regions and AuBe/Pd/Au or Ge/Ni/Au may be used for contacting N-type regions. Other suitable materials may also be used. As such, separate deposition and patterning processes may be used for the individual ohmic contact structures. Conventional methods for forming and patterning the ohmic contact layer to provide discrete contact to each of lower N- or P-type layer 18 and upper P- or N-type layer 19, may be used. For example, conventional lift-off processes or photolithography and etching processes may be used.

In the exemplary embodiment such as shown in FIG. 4 in which the mesa structure is a generally round structure, each of the ohmic contact structures will be generally annular or ring-shaped. To provide contact to upper P- or N-type layer 19, the ohmic contact layer may be patterned to form a ring extending around the mesa structure and disposed internally adjacent the guard ring, such as disposed generally beneath the annular portion of metal lead 14 as shown in FIG. 4. Referring to FIG. 3, ohmic contact structure 2 may overlap the guard ring slightly. The segment of the ohmic contact structure 2, which contacts lower P- or N-type layer 18, may form a ring circumferentially surrounding the mesa structure and in direct contact with the lower P- or N-type layer 18. The ohmic contact structure contacting lower P- or N-type layer 18 is disposed generally beneath the annular portion of metal lead 24 shown in FIG. 3.

After the ohmic contact layers are formed and patterned, an anti-reflective passivation layer 3 may be formed as shown in FIG. 3. In an exemplary embodiment, silicon nitride ($Si_3N_4$) may be used, but other materials chosen to be transparent to light having the wavelength desired to be detected, may be used in other exemplary embodiments. Organic dielectrics may be used, for example. Passivation layer 3 is chosen to be transparent to light of the desired wavelength in active region 50, the region in which passivation layer 3 includes detector surface 7. The thickness and refractive index of passivation layer 3 may be engineered using techniques known in the art, to produce a transparent, anti-reflective film. According to an exemplary embodiment, passivation layer 3 will be formed by a single operation and include the same thickness in all areas throughout the film which extends in the active regions as well as the non-optically targeted, inactive areas. Conventional film formation methods may be used to form passivation layer 3. Contact openings are then formed through passivation layer 3 to allow for contact to be formed between an interconnect metal lead and each of lower P- or N-type layer 18 and upper P- or N-type layer 19, through the associated ohmic contact structure 2.

According to another exemplary embodiment, a mesa structure may not be used. Instead, portions of lower P- or N-type layer 18 that extend into inactive or non-optically targeted area 52, may be exposed and contacted by forming a via and introducing a conductive material into the via to contact lower P- or N-type layer 18. Upper P- or N-type layer 19 may be similarly contacted and each may include a discrete ohmic contact formed between the respective P- or N-type layer and the interconnect material to be subsequently formed. If substrate 10 is a conductive material, contact may be made to lower P- or N-type layer 18 through the substrate. According to the exemplary embodiment in which the substrate 10 is a conductive material and functions as the lower electrode, the substrate may be contacted directly. Passivation layer 3 may also be included in the non-mesa embodiments, and may include openings therethrough for interconnect contacts.

Interconnect leads formed of metals or other conductive materials, are formed to contact the PIN photodetector and couple the PIN photodetector to a bond pad or the like. The interconnect leads as well as the bond pads to which they are connected, may each be formed over the electrically insulating areas that are described above. Metal layer 4 shown in FIG. 3 is an interconnect structure which provides for electrical connection between upper P- or N-type layer 19 and a bond pad (not shown in FIGS. 3 or 4) and also provides for connection between lower P- or N-type layer 18 and a bond pad (not shown in FIGS. 3 or 4). Metal layer 4 may be formed of gold, aluminum, copper or their alloys, or other conductive materials, but hereinafter the interconnect leads will be referred to collectively as metals. Metal layer 4 is formed and patterned using conventional methods to form multiple discrete metal leads. FIG. 3 shows that metal interconnect lead 14 formed of metal layer 4 extends away from the PIN structure to provide for contact to a bond pad. Metal interconnect lead 14 is electrically coupled to upper P- or N-type layer 19. Similarly, metal interconnect lead 24 is formed of metal layer 4 and is coupled to lower P- or N-type layer 18, and extends to another bond pad. Metal interconnect lead 14 is desirably formed over portions of inactive area 52 surrounding the PIN photodiode, that have been converted to electrically insulating areas, as above. As such, metal interconnect lead 14 is formed primarily over electrically insulative materials, and not capacitively coupled to subjacent conductors.

The mesa structure provides an expanded contact area between metal interconnect lead 24 of metal layer 4 and lower P- or N-type layer 18, through ohmic contact structure 2. As shown in FIG. 4, the contact between metal interconnect lead 24 and lower P- or N-type layer 18 extends laterally to surround the base of the PIN photodetector mesa. Each of upper P- or N-type layer 19 and lower P- or N-type layer 18 are coupled to the respective metal interconnect leads by a generally annular contact structure. Metal interconnect lead 14 of metal layer 4 contacts upper P- or N-type layer 19 through another ohmic contact structure 2. In alternative embodiments, a mesa structure may not be used, and various other metal interconnect leads may be produced to provide contact to upper P- or N-type layer 19 and lower P- or N-type layer 18, and extend over electrically insulating areas 1.

Figure 9:
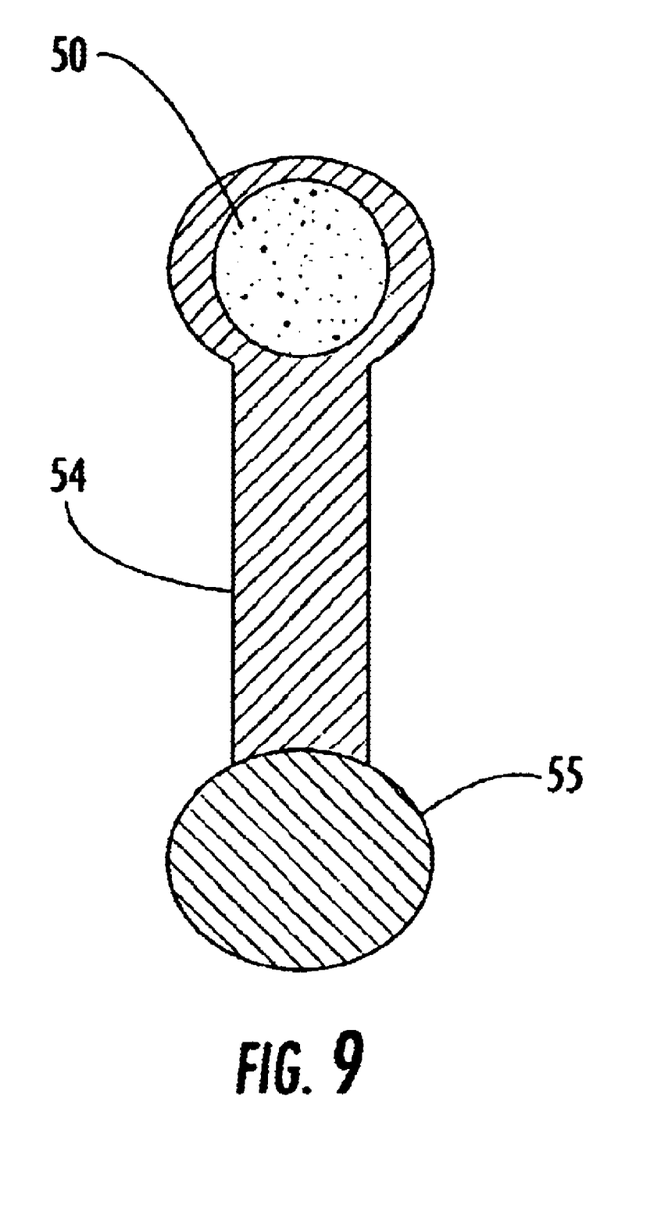
FIG. 9 is a plan view of a PIN photodetector/bond pad arrangement according to the present invention.

FIG. 9 shows exemplary conductive interconnect lead 54 extending to a bond pad 55. In one embodiment, each of conductive interconnect lead 54 and bond pad are each formed over portions of inactive area 52 that have been converted to electrically insulating areas, as above. Conductive interconnect lead 54 may be formed of metals or other conductive materials and may represent metal interconnect lead 14 shown on FIGS. 3 and 4 (in which corresponding metal interconnect lead 24 is not illustrated on FIG. 6) or it may represent a single conductive interconnect lead coupled to a single corresponding bond pad according to the exemplary embodiment in which contact to lower P- or N-type layer is made through the substrate. In this manner, parasitic capacitance is reduced and the bandwidth of the PIN photodetector is increased. Therefore, the PIN photodetector is well suited for high-speed applications.

Referring again to the cross-sectional view shown in FIG. 3, it can be seen that metal layer 4 is substantially isolated from underlying conductors by the isolation implanted region in substantially all areas except where metal layer 4 contacts ohmic contact layer 2 which, in turn, contacts either of upper P or N-type layer 19 or lower P or N-type layer 18 depending on the particular lead of metal layer 4. Therefore the metal interconnect leads formed of metal layer 4, including the bond pad areas, are formed primarily over electrically insulative materials. Since the regions subjacently bordering the contact areas formed between the metal interconnect leads and the electrodes are electrically insulating, the junction capacitance of the photodetector is similarly reduced.

Figure 10:
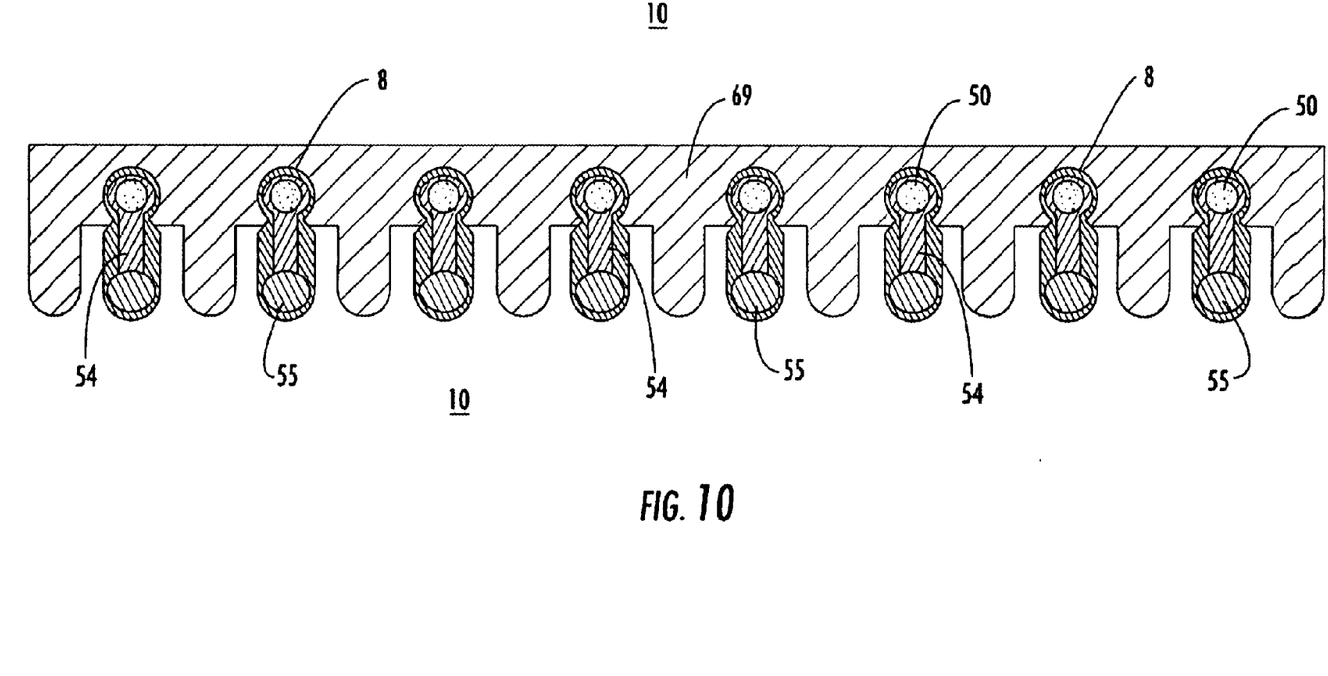
FIG. 10 is a plan view of an array of PIN photodetectors including a common cathode in accordance with the present invention.

FIG. 10 is a plan view of a linear array of eight PIN photodetectors, each including a conductive interconnect lead 54 and corresponding bond pad 55, and an active area 50 formed in a mesa defined by sidewalls 8. According to this mesa exemplary embodiment, metal interconnect lead 54 and bond pad 55 are coupled to the upper electrode which represents the anode of the PIN photodetector. According to this exemplary embodiment, the lower electrodes may be lower P- or N-type layer 18 shown in FIGS. 3 and 4, may extend outward from sidewalls 8 which bound and define the mesa structure. According to the illustrated exemplary embodiment in which the mesa structure is formed over an insulating or semi-insulating substrate 10, each of the lower capacitor electrodes represent cathodes and are connected to common cathode 69 formed of an electrically conducting material which contacts each of the lower electrodes. According to an exemplary embodiment such as illustrated in FIG. 4, each of the lower contacts may extend annularly about sidewalls 8 of the mesa.

Figure 11:
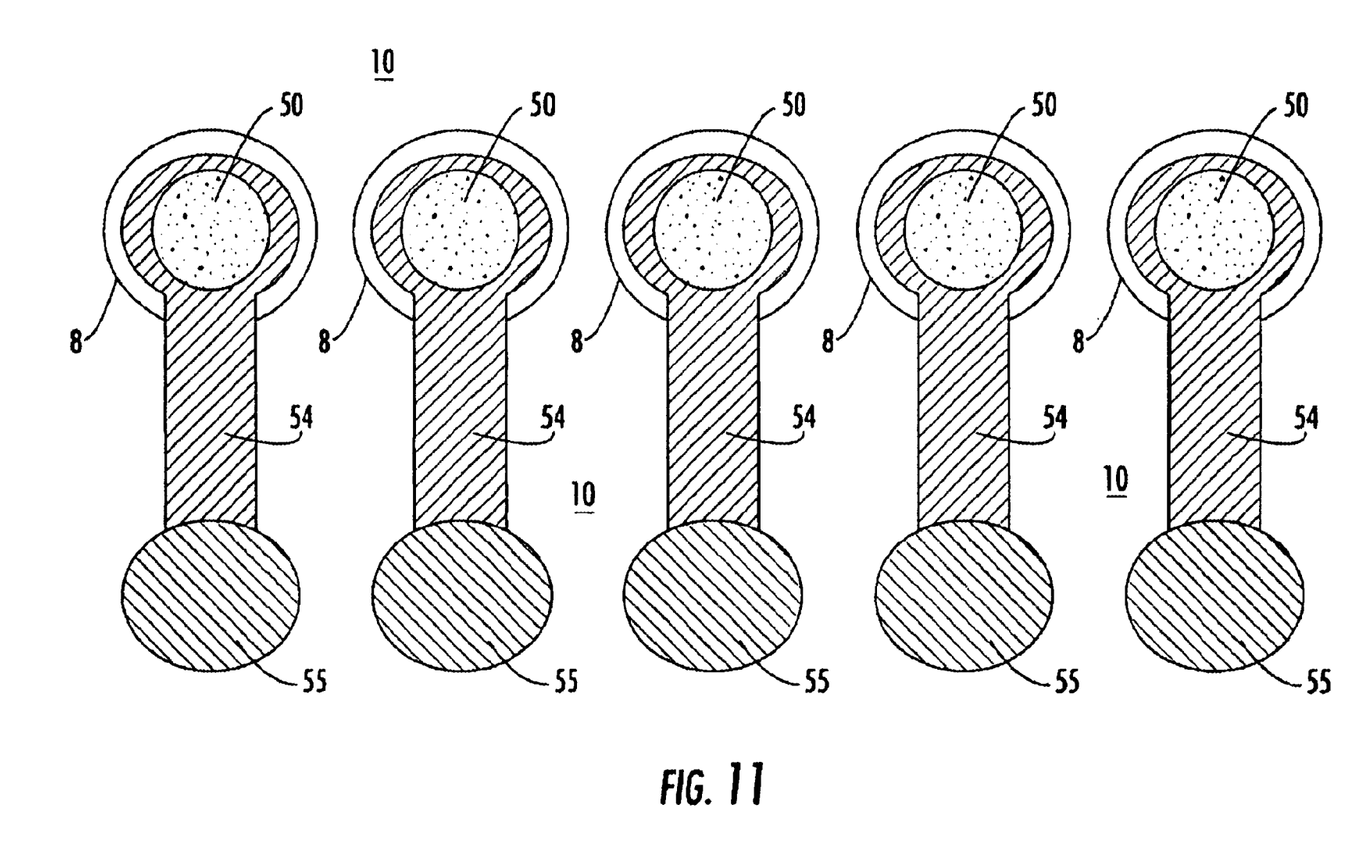
FIG. 11 is a plan view of an array of PIN photodetectors and bond pads in accordance with the present invention.

FIG. 11 shows a plan view of an array of five PIN photodetectors, each including active areas 50 and a corresponding bond pad 55, as described in conjunction with FIG. 9. Each PIN photodetector includes active area 50 formed in a mesa defined by sidewalls 8. The linear array arrangement of five photodetectors is exemplary only and various other one and two-dimensional arrays of various numbers of PIN photodetectors may be formed in other exemplary embodiments. Each interconnect lead 54 and corresponding bond pad 55 may represent an anode terminal and substrate 10, over which the PIN photodetectors are formed, may be a conductive substrate serving as the cathode.

The array arrangements shown in the preceding figures are exemplary only and various other linear and two-dimensional arrays may be used alternatively.

The above-described embodiments are intended to be exemplary only, and the methods for forming the electrically insulating areas according to the present invention may be applied to various PIN photodetector structures. For example, the PIN photodetectors may use various different films having characteristics, such as composition and thickness, that will vary depending on the operational characteristics of the PIN photodetector, such as the wavelength of light to be absorbed and detected. According to various exemplary embodiments, the PIN photodetector structure may be optimized for light having wavelengths of 850 nm, 1.3 microns, 1.55 microns or other wavelengths. According to other exemplary embodiments, the PIN photodetector structure may be formed over other substrates such as indium phosphide (InP). According to this embodiment, the optional semiconductor mirror, the lower P- or N-type layer, the intrinsic layer, the upper P- or N-type layer, and any additional layers such as an etch stop layer, may be chosen to be lattice matched to the substrate on which they are formed. Accordingly, each of the N- and P-type layers may be formed of InP and the etch stop layer may be formed of InAlAs. The intrinsic layer may be InGaAs or other materials which are lattice matched to the InP substrate. In this exemplary embodiment, a semiconductor mirror may additionally be included beneath the PIN photodetector and will also be chosen to be lattice matched to the InP substrate. According to this exemplary embodiment, a similar process sequence, such as detailed above, may be used to form an isolation implant area by introducing a proton or other ionic impurity into the stack of layers outside of the active region of the PIN photodetector in order to isolate the PIN photodetector and electrically insulate the metal interconnect lines from underlying conductors to reduce device parasitic capacitance and increase bandwidth. Similarly, the other methods for forming the electrically insulating portions of the inactive area may be used.

The preceding merely illustrates the principles of the invention. It will thus be appreciated that those skilled in the art will be able to devise various arrangements which, although not explicitly described or shown herein, embody the principles of the invention and are included within its scope and spirit. Furthermore, all examples and conditional language recited herein are principally intended expressly to be only for pedagogical purposes and to aid in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and the functional equivalents thereof. Additionally, it is intended that such equivalents include both currently known equivalents and equivalents developed in the future, i.e., any elements developed that perform the same function, regardless of structure. The scope of the present invention, therefore, is not intended to be limited to the exemplary embodiments shown and described herein. Rather, the scope and spirit of the present invention is embodied by the appended claims.

What is claimed is:

1. A photodetector including an upper electrode formed of one of an N-type material and a P-type material, an intermediate intrinsic layer and a lower electrode formed of the other of the N-type and P-type materials, the photodetector comprised of a stack of layers formed over a substrate and including at least the intermediate intrinsic layer and an upper layer, the upper layer forming the upper electrode, an active area for detecting light defined within the stack of layers, and an inactive area, and the upper layer being coupled to a conductive interconnect lead that extends over an electically insulating region of the inactive area formed to reduce capacitance between the conductive interconnect lead and other portions of the photodetector.

2. The photodetector as in claim 1, wherein the stack of layers further includes a lower layer that forms the lower electrode.

3. The photodetector as in claim 1, in which the substrate is formed of a conductive material and forms the lower electrode in the active area.

4. The photodetector as in claim 1, in which the substrate comprises a semiconductor substrate and the electrically insulating region extends into the semiconductor substrate and is an impurity region containing a sufficiently high concentration of impurity species to render the substrate essentially electrically insulating.

5. The photodetector as in claim 1, in which the electrically insulating region is an impurity region containing a sufficiently high concentration of an impurity species to render the impurity region essentially electrically insulating.

6. The photodetector as in claim 5, wherein the impurity species comprises a proton source.

7. The photodetector as in claim 2, wherein each of the upper layer, the intrinsic layer and the lower layer extend into the inactive area and the electrically insulating region comprises at least part of the stack.

8. The photodetector as in claim 7, in which the electrically insulating region is an impurity region containing a sufficiently high concentration of one of protons and other ionic species to render the impurity region essentially electrically insulating.

9. The photodetector as in claim 1, further comprising a semiconductor mirror disposed in the active area over the substrate and beneath the stack of layers.

10. The photodetector as in claim 1, further comprising a VCSEL structure disposed between the intermediate intrinsic layer and the substrate.

11. The photodetector as in claim 1, in which the conductive interconnect lead is coupled to a bond pad further formed over at least a portion of the electrically insulating region.

12. The photodetector as in claim 2 further comprising a further conductive interconnect lead coupled to the lower layer, the further conductive interconnect lead extending over the electrically insulating region.

13. The photodetector as in claim 12, in which the upper layer and intermediate layer comprise a mesa structure.

14. The photodetector as in claim 13, in which the upper layer is coupled to the conductive interconnect lead through an essentially annular contact structure and the lower layer is coupled to the further conductive interconnect lead through an essentially annular contact structure.

15. The photodetector as in claim 13, in which the mesa structure includes sidewalls and a peripheral portion, and further comprising a guard ring formed of an impurity species included within the peripheral portion of the upper layer, the impurity species rendering the guard ring essentially electrically insulating.

16. The photodetector as in claim 15, wherein the impurity species comprise one of protons and other ionic species.

17. The photodetector as in claim 1, in which the electrically insulating region includes a dielectric material formed over an impurity region that is essentially electrically insulating.

18. The photodetector as in claim 1, in which the stack extends into the inactive area and the electically insulating region includes portions of the stack in the inactive area.

19. The photodetector as in claim 3, in which the electrically insulating region includes a dielectric material formed over a substrate region that includes a sufficiently high concentration of impurity species therein to render the substrate region essentially electrically insulating.

20. The photodetector as in claim 2, further comprising an etch stop layer disposed between the lower layer an the intermediate layer in the active area, the etch stop layer extending into the inactive area, and the electrically insulating region including a dielectric material formed over the etch stop layer.

21. The photodetector as in claim 20, in which the electrically insulating region includes impurity species formed within and below the etch stop layer.

22. An array of at least two photodetectors formed on a common substrate, each photodetector including an upper electrode formed of one of an N-type material and a P-type material, an intermediate intrinsic layer and a lower electrode formed of the other of the N-type and P-type materials, the photodetector comprised of a stack of layers formed over the substrate and including at least the intermediate intrinsic layer and an upper layer, the upper layer forming the upper electrode, an active area for detecting light defined within the stack of layers, and an inactive area, the upper layer being coupled to a conductive interconnect lead that extends over an electrically insulating region of the inactive area formed to reduce capacitance between the conductive interconnect lead and other portions of the photodetector.

23. A photodetector of the type including an upper electrode formed of one of an N-type material and a P-type material, an intermediate intrinsic layer and a lower electrode formed of the other of the N-type and P-type materials, said photodetector comprising:

a substrate;

a stack of layers formed over said substrate, said stack of layers comprising at least an intermediate intrinsic layer and an upper layer, said upper layer forming said upper electrode, said stack of layers including an active area for detecting light defined within the stack, and an inactive area adjacent said active area, said inactive area having a portion thereof treated so as to form an electically insulating region thereof adjacent to said active area, a conductive interconnect lead extending over said electrically insulating region of said inactive area, said upper layer being coupled to said conductive interconnect lead, said insulating region of said inactive area being configured and arranged to reduce capacitance between the conductive interconnect lead and other portions of the photodetector.

24. The photodetector of claim 23, wherein the stack of layers further includes a lower layer that forms the lower electrode.

25. The photodetector of claim 23, in which the substrate is formed of a conductive material and forms the lower electrode in the active area.

26. The photodetector of claim 23, in which the substrate comprises a semiconductor substrate and the electrically insulating region extends into the semiconductor substrate and is an impurity region containing a sufficiently high concentration of impurity species to render the substrate essentially electrically insulating.

27. The photodetector of claim 24, wherein each of the upper layer, the intrinsic layer and the lower layer extend into the inactive area and the electrically insulating region comprises at least part of the stack.

28. The photodetector of claim 23, further comprising a semiconductor mirror disposed in the active area over the substrate and beneath the stack of layers.

29. The photodetector of claim 23, further comprising a VCSEL structure disposed between the intermediate intrinsic layer and the substrate.

30. The photodetector of claim 23, in which the conductive interconnect lead is coupled to a bond pad further formed over at least a portion of the electrically insulating region.

31. The photodetector of claim 24 further comprising a further conductive interconnect lead coupled to the lower layer, the further conductive interconnect lead extending over the electrically insulating region.

32. The photodetector of claim 31, in which the upper layer and intermediate layer comprise a mesa structure.

33. The photodetector of claim 32, in which the upper layer is coupled to the conductive interconnect lead through an essentially annular contact structure and the lower layer is coupled to the further conductive interconnect lead through an essentially annular contact structure.

34. The photodetector of claim 32, in which the mesa structure includes sidewalls and a peripheral portion, and the further comprising a guard ring formed of an impurity species included within the peripheral portion of the upper layer, the impurity species rendering the guard ring essentially electrically insulating.

* * * * *